(12) United States Patent
Liu et al.

(10) Patent No.: US 11,335,744 B2
(45) Date of Patent: May 17, 2022

(54) ARRAY SUBSTRATE, DISPLAY PANEL AND DISPLAY APPARATUS

(71) Applicant: Yungu (Gu'an) Technology Co., Ltd., Langfang (CN)

(72) Inventors: Rusheng Liu, Kunshan (CN); Junhui Lou, Kunshan (CN); Lu Zhang, Kunshan (CN); Jie Sun, Kunshan (CN); Meng Zhang, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 120 days.

(21) Appl. No.: 17/038,475

(22) Filed: Sep. 30, 2020

(65) Prior Publication Data

US 2021/0013277 A1 Jan. 14, 2021

Related U.S. Application Data

(63) Continuation of application No. PCT/CN2019/092260, filed on Jun. 21, 2019.

(30) Foreign Application Priority Data

Dec. 28, 2018 (CN) .......................... 201811627577.X

(51) Int. Cl.
  *H01L 27/32* (2006.01)
  *H01L 51/52* (2006.01)

(52) U.S. Cl.
  CPC ...... *H01L 27/3234* (2013.01); *H01L 27/3246* (2013.01); *H01L 51/5209* (2013.01);
  (Continued)

(58) Field of Classification Search
  CPC ....... H01L 27/3216; H01L 27/32–3293; H01L 51/00–56
  See application file for complete search history.

(56) References Cited

U.S. PATENT DOCUMENTS

2004/0251821 A1 12/2004 Cok
2014/0063370 A1 3/2014 Ko et al.
(Continued)

FOREIGN PATENT DOCUMENTS

CN 1920934 A 2/2007
CN 104952899 A 9/2015
(Continued)

OTHER PUBLICATIONS

International Search Report dated Oct. 14, 2019 in corresponding International application No. PCT/CN2019/092260; 4 pages.
(Continued)

*Primary Examiner* — Suberr L Chi
(74) *Attorney, Agent, or Firm* — Maier & Maier, PLLC

(57) ABSTRACT

An array substrate, a display panel, and a display apparatus. The array substrate includes a base substrate; a first electrode layer formed on the base substrate; a light emitting layer formed on the first electrode layer and including a non-transparent first light emitting region, a second light emitting region, and a transparent third light emitting region; and a second electrode layer formed on the light emitting layer. The first light emitting region includes first light emitting structures. The second light emitting region includes second light emitting structures. The third light emitting region includes third light emitting structures. The second light emitting region is located between the first light emitting region and the third light emitting region. A distribution density of first light emitting structures, a distribution density of second light emitting structures, and a distribution density of third light emitting structures are gradually changed in sequence.

20 Claims, 15 Drawing Sheets

(52) U.S. Cl.
CPC ...... *H01L 51/5234* (2013.01); *H01L 51/5281* (2013.01); *H01L 2251/308* (2013.01)

(56) References Cited

U.S. PATENT DOCUMENTS

| | | |
|---|---|---|
| 2016/0372514 A1 | 12/2016 | Chang et al. |
| 2018/0005006 A1 | 1/2018 | Chai et al. |
| 2018/0158847 A1 | 6/2018 | Chang et al. |

FOREIGN PATENT DOCUMENTS

| | | |
|---|---|---|
| CN | 204651324 U | 9/2015 |
| CN | 107275376 A | 10/2017 |
| CN | 107564470 A | 1/2018 |
| CN | 107610635 A | 1/2018 |
| CN | 207338380 U | 5/2018 |
| CN | 108269840 A | 7/2018 |
| CN | 108766990 A | 11/2018 |
| CN | 109085717 A | 12/2018 |
| WO | WO2020150963 A1 * | 7/2020 |
| WO | WO2020154861 A1 * | 8/2020 |

OTHER PUBLICATIONS

Written Opinion of the International Searching Authority dated Oct. 14, 2019 in corresponding International application No. PCT/CN2019/092260; 4 pages.

Office Action and Search Report dated Sep. 25, 2020 in corresponding Chinese application No. 201811627577.X; 20 pages.

* cited by examiner

ARRAY SUBSTRATE, DISPLAY PANEL AND DISPLAY APPARATUS

CROSS REFERENCE TO RELATED APPLICATIONS

This disclosure is a continuation of International Patent Application No. PCT/CN2019/092260, filed on Jun. 21, 2019, which claims priority to Chinese Patent Application No. 201811627577.X, titled "ARRAY SUBSTRATE, DISPLAY PANEL AND DISPLAY APPARATUS", filed on Dec. 28, 2018, the contents of all of which are incorporated herein by reference.

TECHNICAL FIELD

The present disclosure relates to the technical field of display, and in particular to an array substrate, a display panel, and a display apparatus.

BACKGROUND

With the rapid development of electronic devices, users have higher and higher requirements for screen-to-body ratio, so that full-screen display of electronic devices has received more and more attention from the industry.

SUMMARY

In order to solve the technical problems in the related art, the present disclosure provides an array substrate, a display panel, and a display apparatus.

In a first aspect, an embodiment of the present disclosure provides an array substrate including a base substrate, a first electrode layer, a light emitting layer, and a second electrode layer. The first electrode layer is formed on the base substrate. The light emitting layer is formed on the first electrode layer and includes a non-transparent first light emitting region, a second light emitting region, and a transparent third light emitting region. The second electrode layer is formed on the light emitting layer. The first light emitting region includes a plurality of first light emitting structures. The second light emitting region includes a plurality of second light emitting structures. The third light emitting region includes a plurality of third light emitting structures. The second light emitting region is located between the first light emitting region and the third light emitting region. A distribution density of the plurality of first light emitting structures, a distribution density of the plurality of second light emitting structures, and a distribution density of the plurality of third light emitting structures are gradually changed in sequence.

In a second aspect, an embodiment of the present disclosure provides a display panel, which includes the array substrate as described above and an encapsulation layer. The encapsulation layer is provided on a side of the array substrate where the second electrode layer is located.

In a third aspect, an embodiment of the present disclosure provides a display apparatus including a body having a component region, and the display panel as described above. The display panel is provided on a side of the body where the component region is located. A region of the display panel corresponding to the third emitting region covers the component region, and the component region includes photoreceptor units to emit or collect light through the region of the display panel corresponding to the third light emitting region.

It can be seen from the above embodiments that, in the array substrate provided by the present disclosure, the distribution density of the first light emitting structures, the distribution density of the second light emitting structures, and the distribution density of the third light emitting structures are gradually changed sequentially to enable the pixel densities as well as the resolutions per unit area of the first light emitting region, the second light emitting region, and the third light emitting region to be gradually changed sequentially, thereby avoiding sudden changes of the display between the first light emitting region and the third light emitting region, and improving the display effect.

DETAILED DESCRIPTION OF THE EMBODIMENTS

Figure 1:
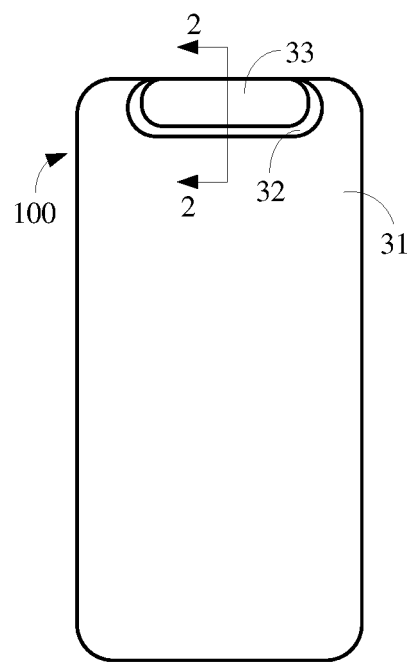
FIG. 1 is a schematic structural diagram illustrating an array substrate according to an exemplary embodiment of the present disclosure.

Examples will be described in detail herein, with the illustrations thereof represented in the drawings. When the following descriptions involve the drawings, like numerals in different drawings represent like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

It is to be understood that, although terms "first", "second", "third", and the like may be used in the present disclosure to describe various information, such information should not be limited to these terms. These terms are only used to distinguish one type of information from another. For example, without departing from the scope of the present disclosure, first information may be referred to as second information; and similarly, second information may also be referred to as first information. Depending on the context, the word "if" as used herein may be interpreted as "when" or "upon" or "in response to determining" The following various examples can be combined with each other without any contradiction.

As an electronic device such as a mobile phone, a tablet computer, etc., needs to be integrated components such as a front camera, a receiver, and an infrared sensor element, etc., a notch is provided on the display panel of the electronic devices to mount the camera, the receiver and the infrared sensor element, etc. However, the notch area on the display panel, such as a screen with the notch, may not be used to display images. Optionally, a hole may be provided on the screen of the display panel to mount the camera, etc. therein. In this case, for the electronic device that implements a camera function, external light may enter into photoreceptor units disposed beneath the screen through the hole on the screen, which may cause an undesirable imaging effect. In this way, the displays of these electronic devices may not achieve an excellent full-screen display, that is, the screen-to-body ratio of the display panel equipped on the electronic device is not close to 100%. Thus, such electronic devices may not perform the display function in each region of the entire screen. For example, the screen may not display images in the camera region.

Based on the current full-screen development trend of the electronic devices, how to increase the screen-to-body ratio of the display panel of the electronic device while ensuring the front light sensing function of the electronic device has become an urgent problem to be solved in the art.

Figure 2:
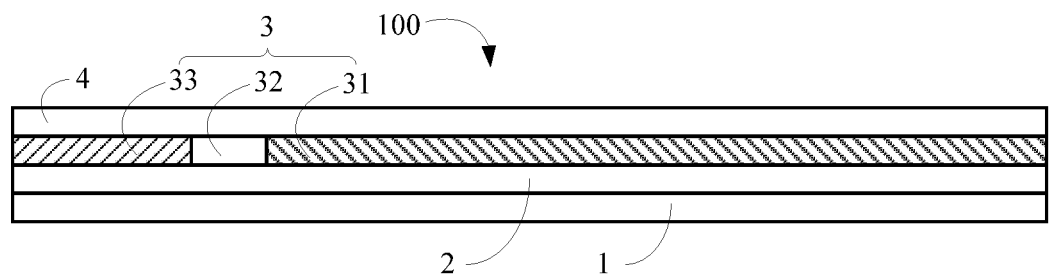
FIG. 2 is a cross-sectional view taken along line 2-2 in FIG. 1.

Based on this, the present disclosure provides an array substrate 100 as shown in FIGS. 1 and 2. The array substrate 100 may include a base substrate 1, a first electrode layer 2, a light emitting layer 3, and a second electrode layer 4. The base substrate 1 may include a layer structure including a substrate, an inorganic layer, an organic layer and the like. The substrate may include a flexible substrate or a rigid substrate. The flexible substrate may be made of flexible material, and the flexible material may be polyimide (referred briefly to as PI) polymer, polycarbonate (referred briefly to as PC) resin (also called PC plastic), polyethylene terephthalate (referred briefly to as PET) plastic, etc. The rigid substrate may be made of organic glass material. The first electrode layer 2 is formed on the base substrate 1, the light emitting layer 3 is formed on the first electrode layer 2, and the second electrode layer 4 is formed on the light emitting layer 3.

In this embodiment, the light emitting layer 3 may include a first light emitting region 31, a second light emitting region 32, and a third light emitting region 33. The second light emitting region 32 is located between the first light emitting region 31 and the third light emitting region 33. The first light emitting region 31 is a non-transparent region, and the third light emitting region 33 is a transparent region. Based on this, the first light emitting region 31 may ensure the normal display of the display panel equipped with the array substrate 100, and the third light emitting region 33 may form a transparent display region on the display panel equipped with the array substrate 100, so that external light may enter into the inside of the electronic device equipped with the display panel through the transparent display region, so as to allow the photoreceptor units inside the electronic device to collect light signals. Therefore, while ensuring the normal operation of the photoreceptor units, the display region of the electronic device may not be occupied to improve the screen-to-body ratio of the electronic device.

Further, since the first light emitting region 31 is the non-transparent region, and the third light emitting region 33 is the transparent region, when the display panel equipped with the array substrate 100 is displaying, there is a difference in terms of display effect. For example, since the third light emitting region is the transparent region, it may transmit light bidirectionally, which is different from the first light emitting region 31 in brightness. The array substrate in the present disclosure further includes the second light emitting region 32 between the first light emitting region 31 and the third light emitting region 33, so that the display of the first light emitting region 31 and the third light emitting region 33 may be transitioned through the second light emitting region 32, so as to avoid sudden changes of the display in the user's vision, which may improve the display effect.

The ratio of the first light emitting region 31 to the third light emitting region 33 may be designed as required. For example, when the first light emitting region 31 serves as the main display region on the display panel equipped with the array substrate 100, the first light emitting region 31 may occupy the most part of the array substrate, and the third light emitting region 33 occupies a portion of region on the top of the array substrate, as shown in FIG. 1. Of course, in other embodiments, the photoreceptor units in the electronic device equipped with the array substrate 100 are disposed corresponding to the third light emitting region 33. When more photoreceptor units need to be arranged, a size (e.g., an area) of the third light emitting region 33 may be appropriately increased, which is not limited in the present disclosure. Further, at least a part of the third light emitting region 33 is surrounded by the first light emitting region 31, and the third light emitting region 33 may include an arc-shaped edge as shown in FIG. 1, which, specifically, may be elliptical, circular, or drop-shaped. Of course, in other embodiments, the third light emitting region 33 may also be rectangular, such as square or oblong, which is not limited in the present disclosure.

Figure 3:
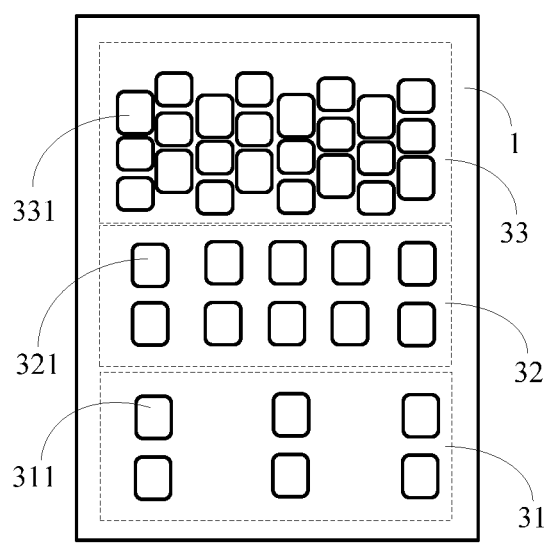
FIG. 3 is a schematic structural diagram illustrating another array substrate according to an exemplary embodiment of the present disclosure.

Specifically, as shown in FIG. 3, the first light emitting region 31 may include a plurality of first light emitting structures 311, the second light emitting region 32 may include a plurality of second light emitting structures 321, and the third light emitting region 33 may include a plurality of third light emitting structures 331. The plurality of third light emitting structures 331 are all transparent light emitting structures. To simplify the process, the plurality of first light emitting structures 311, the second light emitting structures 321, and the plurality of third light emitting structures 331 are formed by the same process. The plurality of first light emitting structures 311 and the second light emitting structures 321 may also be transparent light emitting structures. Of course, in other embodiments, one of the first light emitting structure 311 and the second light emitting structure 321 may be transparent light emitting structure, and the other may be non-transparent light emitting structure. Optionally, in other embodiments, the first light emitting structure 311 and the second light emitting structure 321 may be both non-transparent light emitting structures, which is not limited in the present disclosure.

In this embodiment, a distribution density of the plurality of first light emitting structures 311, a distribution density of the plurality of second light emitting structures 321, and a distribution density of the plurality of third light emitting structures 331 are gradually and sequentially changed, so that a pixel aperture ratio of the plurality of first light emitting structures 311, a pixel aperture ratio of the plurality of second light emitting structures 321, and a pixel aperture ratio of the plurality of third light emitting structures 331 are changed gradually and sequentially. Based on this, pixel densities of the first light emitting region 31, the second light emitting region 32, and the third light emitting region 33 may be changed gradually and sequentially, so that the resolutions per unit area of the first light emitting region 31, the second light emitting region 32, and the third light emitting region 33 are changed gradually and sequentially, which may avoid sudden changes and improve the display effect.

In an embodiment, as shown in FIG. 3, the distribution density of the plurality of first light emitting structures 311, the distribution density of the plurality of second light emitting structures 321, and the distribution density of the plurality of third light emitting structures 331 may be gradually and sequentially changed.

Figure 4:
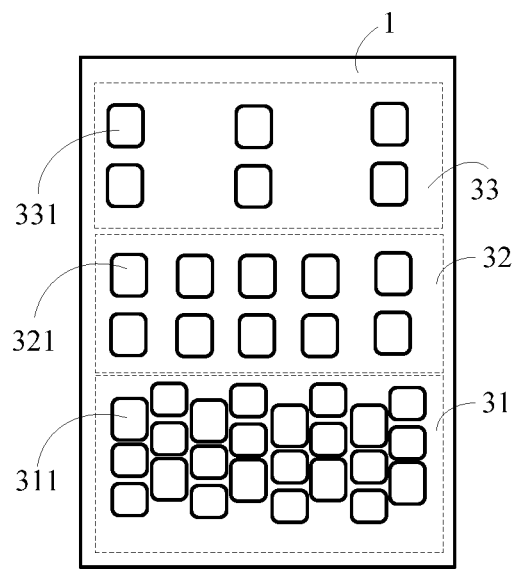
FIG. 4 is a schematic structural diagram illustrating another array substrate according to an exemplary embodiment of the present disclosure.

In another embodiment, as shown in FIG. 4, the distribution density of the plurality of first light emitting structures 311, the distribution density of the plurality of second light emitting structures 321, and the distribution density of the plurality of third light emitting structures 331 may be decreased gradually and sequentially. In the embodiments shown in FIGS. 3 and 4, the distribution density may be determined by a distance between adjacent light emitting structures and an area of each light emitting structure. As shown in FIG. 4, since the distribution density of the plurality of first light emitting structures 311, the distribution density of the plurality of second light emitting structures 321, and the distribution density of the plurality of third light emitting structures 331 are decreased gradually and sequentially, there is one case where the distance between adjacent light emitting structures may be increased, so that the pixel densities corresponding to the first light emitting region 31 and the third light emitting region 33 may be decreased sequentially to realize display transition, and at the same time, the probability of diffraction occurring in the third light emitting region 33 may be reduced. Optionally, the areas of the light emitting structures may be increased to sequentially decrease the pixel densities corresponding to the first light emitting region 31 and the third light emitting region 33 to realize display transition and decrease the number of voids existing in the third light emitting region 33 to reduce the probability of diffraction occurring in the third light emitting region 33.

For example, as shown in FIG. 4, the distance between adjacent first light emitting structures 311, the distance between adjacent second light emitting structures 321, and the distance between adjacent third light emitting structures 331 are increased gradually, so that the distribution density of the plurality of first light emitting structures 311, the distribution density of the plurality of second light emitting structures 321, and the distribution density of the plurality of third light emitting structures 331 are gradually decreased sequentially. Moreover, in the case where the areas of the first light emitting structure 311, the second light emitting structure 321, and the third light emitting structure 331 are equal, by increasing the distance between adjacent light emitting structures to decrease the distribution density, the pixel density corresponding to the first light emitting structures 311, the pixel density corresponding to the second light emitting structures 321, and the pixel density corresponding to the third light emitting structures 331 are decreased gradually and sequentially, and at the same time, the processing difficulty of the evaporation mask may be reduced, thereby reducing the evaporation difficulty for the light emitting structures.

Figure 5:
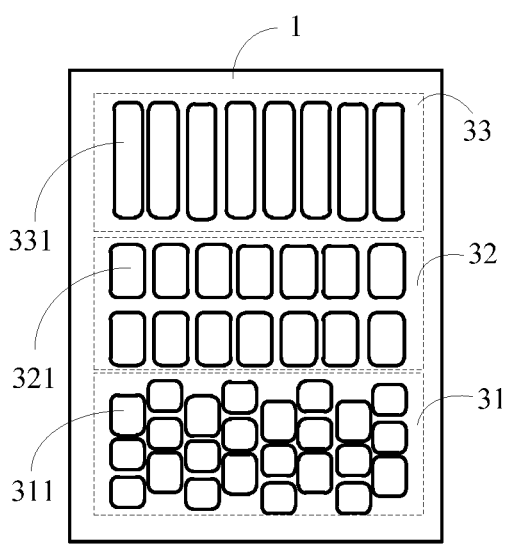
FIG. 5 is a schematic structural diagram illustrating another array substrate according to an exemplary embodiment of the present disclosure.

In another embodiment, as shown in FIG. 5, the areas of the first light emitting structure 311, the second light emitting structure 321, and the third light emitting structure 331 may be gradually increased, so that in the case where the distances between adjacent light emitting structures in each of the first light emitting region 31, the second light emitting region 32 and the third light emitting region 33 are equal, the pixel aperture ratio corresponding to the first light emitting region 31, the pixel aperture ratio corresponding to the second light emitting region 32, and the pixel aperture ratio corresponding to the third light emitting region 33 may be changed sequentially to achieve the display transition. Moreover, the number of voids in the third light emitting region 33 may be decreased, thereby reducing the probability of diffraction to ensure the detection accuracy of the photoreceptor units located beneath the third light emitting region 33.

Figure 6:
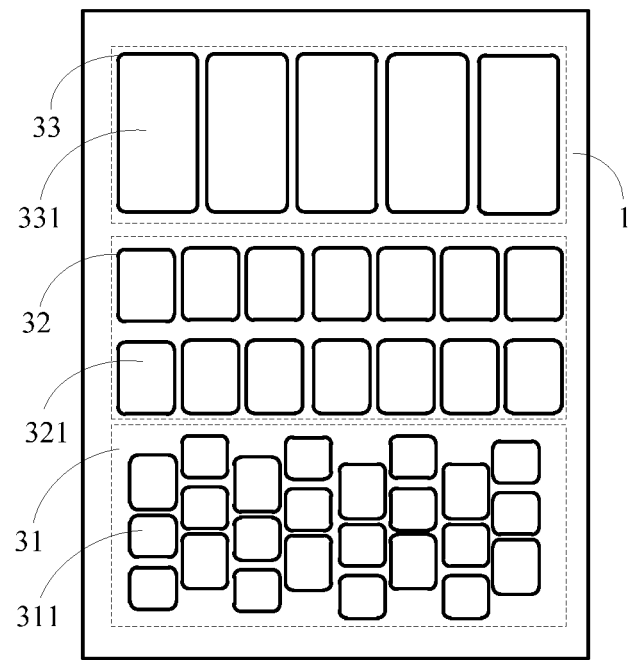
FIG. 6 is a schematic structural diagram illustrating another array substrate according to an exemplary embodiment of the present disclosure.

Specifically, as shown in FIG. 5, a length of the first light emitting structure 311, a length of the second light emitting structure 321, and a length of the third light emitting structure 331 may be increased gradually, for example, with a length ratio of 1:1.2:1.5, or 1:1.5:2, etc. Optionally, as shown in FIG. 6, a width of the first light emitting structure 311, a width of the second light emitting structure 321, and a width of the third light emitting structure 331 may be increased gradually, for example, with a width ratio of 1:1.2:1.5, or 1:1.5:2, etc., which is not particularly limited in the present disclosure. Of course, in some other embodiments, as shown in FIG. 6, the length of the first light emitting structure 311, the length of the second light emitting structure 321, and the length of the third light emitting structure 331 are increased gradually, and at the same time, the width of the first light emitting structure 311, the width of the second light emitting structure 321, and the width of the third light emitting structure 331 are increased gradually, which is not limited in the present disclosure.

Figure 7:
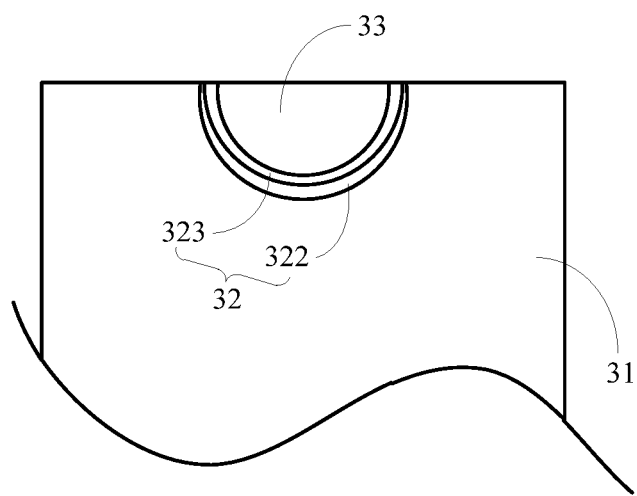
FIG. 7 is a partial schematic diagram illustrating an array substrate according to an exemplary embodiment of the present disclosure.

In the above embodiments, as shown in FIG. 7, the second light emitting region 32 may include a first transition region 322 and a second transition region 323. The first transition region 322 is adjacent to the first light emitting region 31, and the second transition region 323 is located between the first transition region 322 and the third light emitting region 33. Both of the first transition region 322 and the second transition region 323 may be non-transparent regions, and the second transition region 323 is provided with wires and drive circuits. The wires and the drive circuits may be coupled to the third light emitting structures 331 in the third light emitting region 33. Thus, there is no need to arrange wires and circuits in the third light emitting region 33, thereby preventing the user from viewing the internal structure through the third light emitting region 33 from the outside, which may improve the aesthetic effect. Further, the second transition region 323 is configured not to be covered by a polarizer, so as to prevent the polarizer from affecting the light transmission effect.

Figure 8:
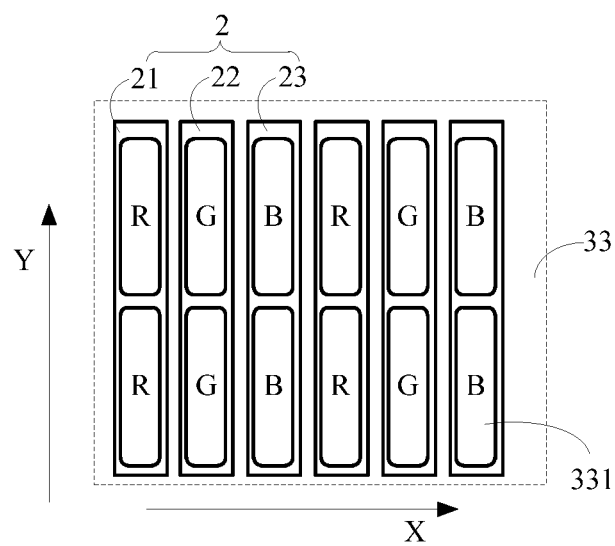
FIG. 8 is a schematic structural diagram illustrating a third light emitting region on an array substrate according to an exemplary embodiment of the present disclosure.

In this embodiment, as shown in FIGS. 7 and 8, the first electrode layer 2 may include a plurality of first electrodes disposed corresponding to the third light emitting region 33, and the plurality of first electrodes are arranged in rows and columns. For example, as shown in FIG. 8, the first electrode layer 2 may include first electrodes 21, 22 and 23. The first electrodes 21, 22 and 23 are arranged side by side along a direction indicated by X, and each first electrode extends along a direction indicated by Y. The first electrodes in each column are connected to the same drive circuit, that is, a column of first electrodes correspondingly arranged in the direction indicated by Y may be driven by the same drive circuit to simplify the circuit arrangement. Optionally, each of the first electrodes may be connected to one drive circuit. For example, as shown in FIG. 8, the first electrode 21 is connected to one drive circuit, the first electrode 22 is connected to one drive circuit, and the first electrode 23 is connected to one drive circuit, which is beneficial to control the display of each third light emitting structure 331 in the third light emitting region 33.

In the above embodiments, as shown in FIG. 8, each of the first electrodes may be provided with a plurality of third light emitting structures 331, and the colors of the third light emitting structures 331 corresponding to the same first electrode are the same. For example, as still shown in FIG. 8, the first electrodes 21, 22 and 23 respectively correspond to two third light emitting structures 331. Moreover, the third light emitting structures 331 corresponding to the first electrode 21 are all red color blocks, the third light emitting structures 331 corresponding to the first electrode 22 are all green color blocks, and the third light emitting structures 331 corresponding to the first electrode 23 are all blue color blocks. Of course, the first electrodes 21, 22 and 23 respectively corresponding to two third light emitting structures 331 is just described herein as an example. In other embodiments, of course, three or more third light emitting structures 331 may also be included. In addition, the number of the third light emitting structures 331 included in different first electrodes may be the same or different, which is not limited in the present disclosure.

Based on this, when the same mask is used for evaporation, since the same first electrode may be formed with a plurality of third light emitting structures 331 in the present disclosure, a region on the mask that is corresponding to the third light emitting region 33 may be formed with a plurality of holes, so that the strength of the mask may be improved, the deformation of the mask may be reduced, and the probability of color mixing among adjacent third light emitting structures 331 may be reduced.

Figure 9:
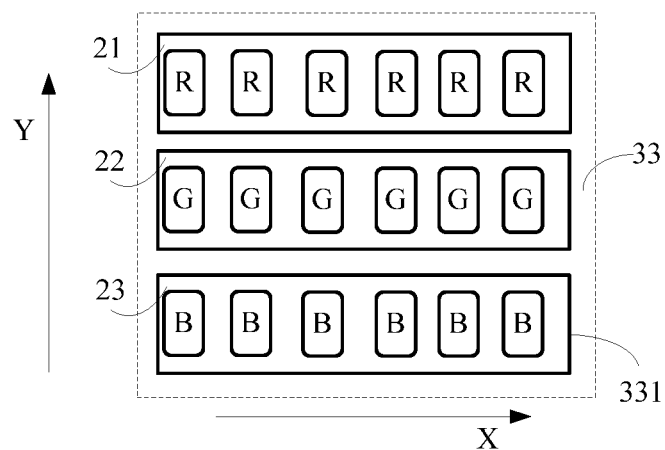
FIG. 9 is a schematic structural diagram illustrating a third light emitting region on an array substrate according to an exemplary embodiment of the present disclosure.

In an embodiment, as still shown in FIG. 8, the first electrode is a strip-shaped electrode, and the plurality of first electrodes may be arranged in the form of one row by multiple columns shown in FIG. 8, or in the form of one row by multiple columns shown in FIG. 9. The column direction of the first electrodes is the direction in which the strip-shaped electrode extends, such as the Y direction shown in FIG. 8 and the X direction shown in FIG. 9. The row direction of the first electrodes is the direction in which the strip-shaped electrodes are arranged side-by-side, such as the X direction in FIG. 8 and the Y direction in FIG. 9.

In this embodiment, the extending direction of the first electrode is parallel or perpendicular to the row direction of the third light emitting structures 331. For example, as shown in FIG. 8, assuming that the direction indicated by X is the row direction of the third light emitting structures 331, the row direction X of the third light emitting structures 331 is perpendicular to the extending direction Y of the first electrode in FIG. 8, and the row direction X of the third light emitting structures 331 is parallel to the extending direction X of the first electrode in FIG. 9. Assuming that the direction indicated by Y is the row direction of the third light emitting structures 331, the row direction Y of the third light emitting structures 331 is parallel to the extending direction of the first electrode in FIG. 8, and the row direction Y of the third light emitting structures 331 is perpendicular to the extending direction of the first electrode in FIG. 9.

Figure 10:
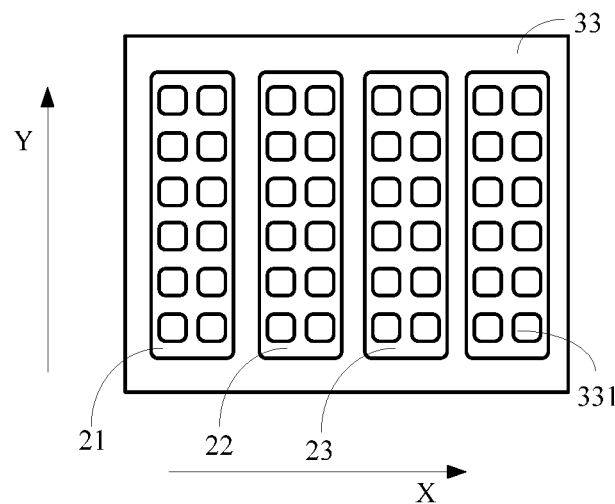
FIG. 10 is a schematic structural diagram illustrating a third light emitting region on an array substrate according to an exemplary embodiment of the present disclosure.

For the plurality of third light emitting structures 331 corresponding to each first electrode, the plurality of third light emitting structures 331 may be regularly arranged. In an embodiment, as shown in FIG. 10, each first electrode may correspond to a plurality of columns of third light emitting structures arranged along a first direction, where the first direction is the extending direction of the first electrode, i.e., the Y direction as shown in FIG. 10. Based on this, compared with an irregular arrangement of the plurality of third light emitting structures 331, in the case where the pixel density corresponding to the third light emitting region 33 remains unchanged, the regular arrangement of the plurality of third light emitting structures 331 may reduce the number of the first electrodes and reduce the processing difficulty while reducing the deformation amount of the mask.

Figure 11:
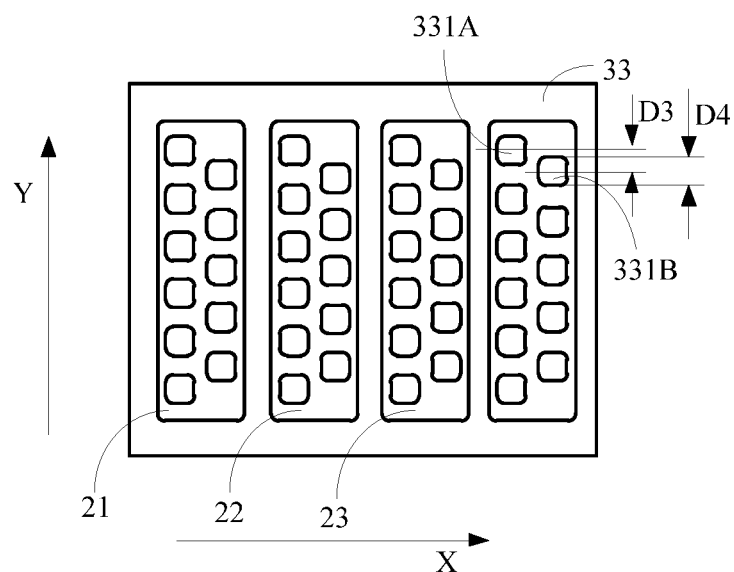
FIG. 11 is a schematic structural diagram illustrating a third light emitting region on an array substrate according to an exemplary embodiment of the present disclosure.

In this embodiment, in a second direction perpendicular to the first direction, that is, in the X direction shown in FIG. 10, two adjacent third light emitting structures 331 on the same first electrode in the X direction are arranged to be aligned. Optionally, as shown in FIG. 11, two adjacent third light emitting structures 331 on the same first electrode in the X direction are arranged to be misaligned (for example, staggered). In this way, the uniformity of the arrangement of the third light emitting structures 331 may be enhanced, and the display effect may be improved.

Figure 12:
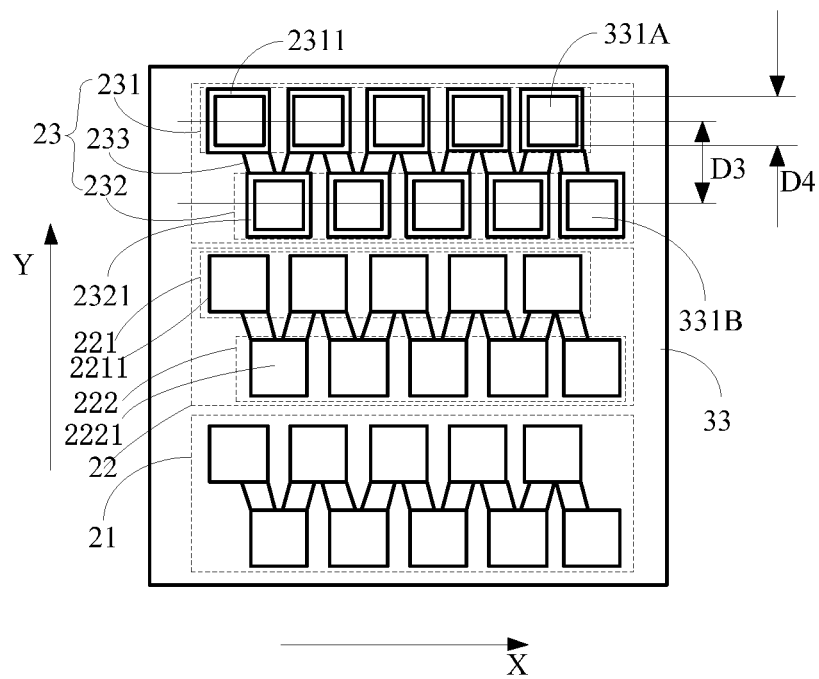
FIG. 12 is a schematic structural diagram illustrating a third light emitting region on an array substrate according to an exemplary embodiment of the present disclosure.

Further, regarding the arrangement manner in which the third light emitting structures 331 shown in FIG. 11 are formed, as still shown in FIG. 11, a distance in the first direction (i.e., the Y direction) between central axes of two adjacent third light emitting structures 331 on the same first electrode in the X direction is 0.5-2 times a size of the third light emitting structure in the first direction. For example, as shown in FIG. 11, the third light emitting structure 331A and the third light emitting structure 331B are misaligned in the X direction, and the distance D3 between the central axes of the third light emitting structure 331A and the third light emitting structure 331B is equal to a width D4 of the third light emitting structure 331B. Of course, the distance D3 being equal to the width D4 is only described herein as an example. In other embodiments, for example, as shown in FIG. 12, the distance D3 is equal to 1.5 times the width D4, i.e., D3=1.5*D4. Of course, in other embodiments, the distance D3 may also be 0.5 times, 0.8 times, 1.2 times or 2 times the width D4, which is not limited in the present disclosure.

Figure 13:
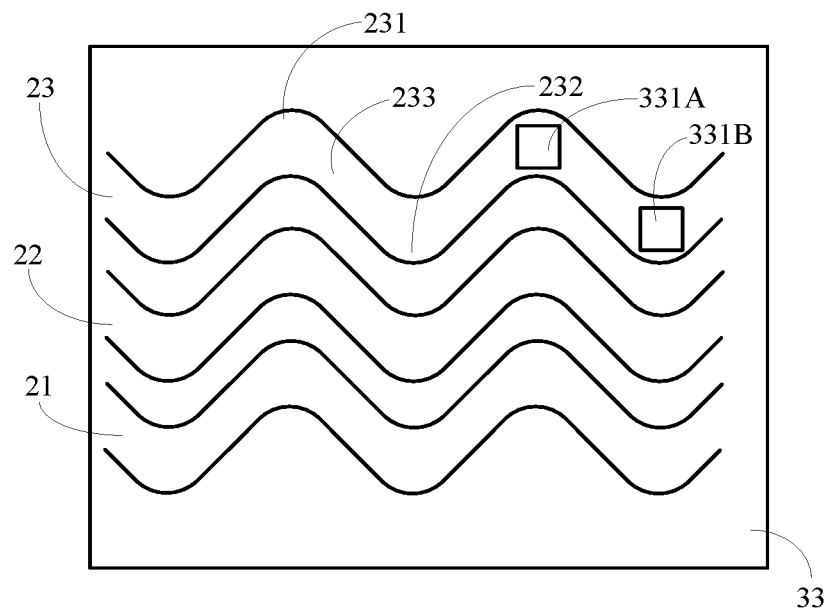
FIG. 13 is a schematic structural diagram illustrating a third light emitting region on an array substrate according to an exemplary embodiment of the present disclosure.

Further, in the present disclosure, as shown in FIGS. 12 and 13, each first electrode may include a connection portion and a plurality of first sub-electrodes. The plurality of first sub-electrodes are arranged in the misaligned manner in the second direction. Each sub-electrode includes a plurality of electrode blocks (block-shaped electrodes or strip-shaped electrodes in the above embodiments), and the connection portion is electrically connected to two adjacent electrode blocks to obtain a wave-shaped first electrode extending in the first direction. Specifically, as shown in FIG. 12, taking the first electrode 23 as an example, the first electrode 23 may include first sub-electrodes 231 and 232. The first sub-electrode 231 includes a plurality of block-shaped electrodes 2311 (the block-shaped electrodes have a one-to-one correspondence with the organic light emitting structures; or a single block-shaped electrode corresponds to a plurality of third light emitting structures), and the second sub-electrode 232 includes a plurality of block-shaped electrodes 2321. The first electrode 23 may further include a connection portion 233 connecting two adjacent block-shaped electrodes 2311 and 2321, so that the wave-shaped first electrode 23 extending in the X direction as shown in FIG. 13 may be obtained. In this embodiment, the first direction is the X direction and the second direction is the Y direction. Of course, in other embodiments, the first direction may be the Y direction and the second direction may be the X direction, which may be adjusted as a whole adaptively.

Figure 14:
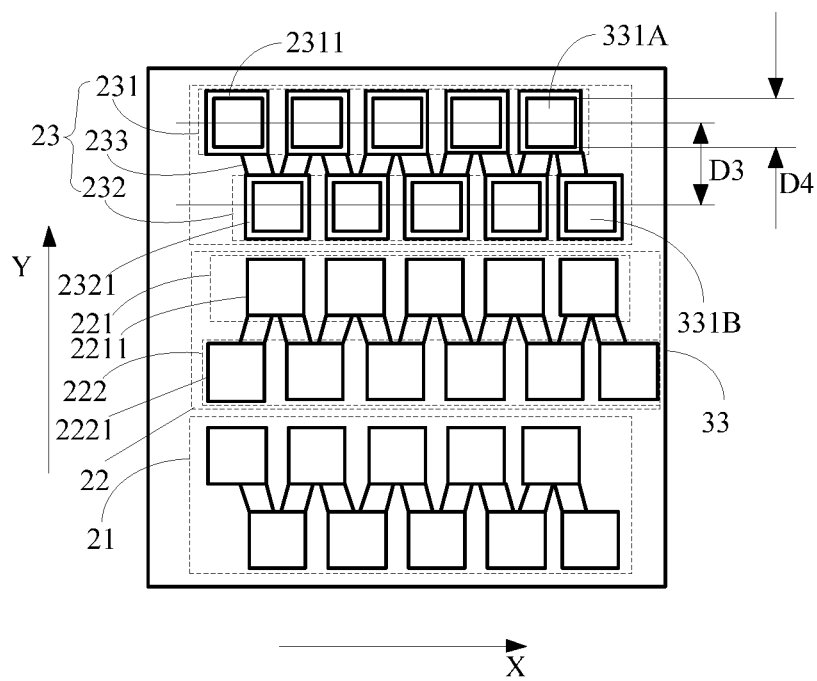
FIG. 14 is a schematic structural diagram illustrating a third light emitting region on an array substrate according to an exemplary embodiment of the present disclosure.
Figure 15:
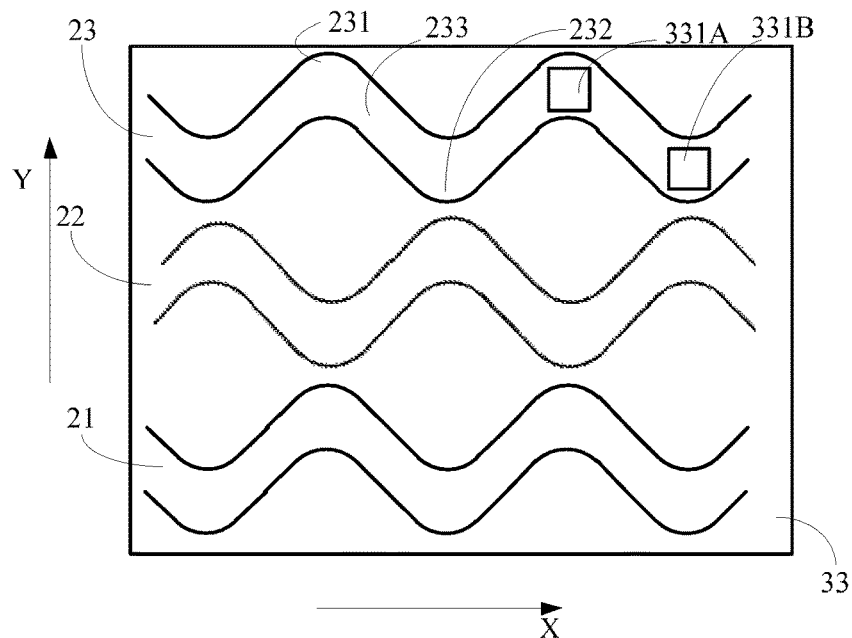
FIG. 15 is a schematic structural diagram illustrating a third light emitting region on an array substrate according to an exemplary embodiment of the present disclosure.

In an embodiment, as still shown in FIGS. 12 and 13, third light emitting structures 331 corresponding to two adjacent first electrodes may be arranged to be aligned. For example, in FIG. 12, the third light emitting structure corresponding to the electrode block 2311 of the first sub-electrode 231 of the first electrode 23 and the third light emitting structure corresponding to the electrode block 2211 of the first sub-electrode 221 of the first electrode 22 are arranged to be aligned in the Y direction; and the third light emitting structure corresponding to the electrode block 2321 of the first sub-electrode 232 of the first electrode 23 and the third light emitting structure corresponding to the electrode block 2221 of the first sub-electrode 222 of the first electrode 22 are arranged to be aligned in the Y direction. Optionally, as shown in FIGS. 14 and 15, third light emitting structures 331 corresponding to two adjacent first electrodes may be arranged to be misaligned, which is not limited in the present disclosure. For example, in FIG. 14, the third light emitting structure corresponding to the electrode block 2311 of the first sub-electrode 231 of the first electrode 23 and the third light emitting structure corresponding to the electrode block 2211 of the first sub-electrode 221 of the first electrode 22 are arranged to be misaligned in the Y direction; and the third light emitting structure corresponding to the electrode block 2321 of the first sub-electrode 232 of the first electrode 23 and the third light emitting structure corresponding to the electrode block 2221 of the first sub-electrode 222 of the first electrode 22 are arranged to be misaligned in the Y direction.

Based on the technical solution of the present disclosure, the first electrode layer 2 is an anode, the second electrode layer 4 is a cathode, and the second electrode layer 4 is a planar electrode, so as to simplify the processing difficulty.

Figure 16:
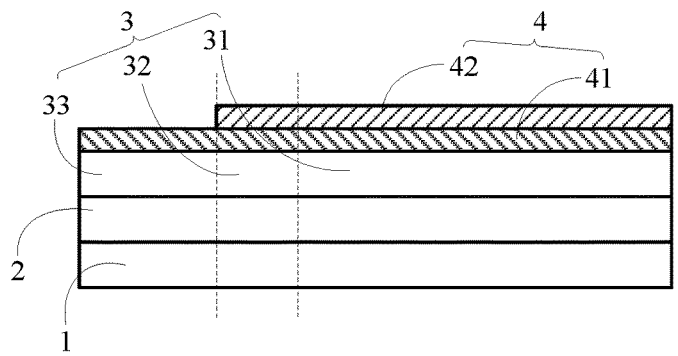
FIG. 16 is a schematic cross-sectional view illustrating an array substrate according to an exemplary embodiment of the present disclosure.

In an embodiment, as shown in FIG. 16, the second electrode layer 4 may include a transparent material layer 41 and a metal layer 42. The transparent material layer 41 may cover the first light emitting region 31, the second light emitting region 32, and the third light emitting region 33. The metal layer 42 may cover the first light emitting region 31 and the second light emitting region 32, and is disposed on the transparent material layer 41. The entire transparent material layer 41 is formed in the same process. By providing the metal layer 42 of the second electrode layer in the first light emitting region 31 and the second light emitting region 32, a resistance of the second electrode layer 4 may be reduced, thereby reducing the voltage drop.

Figure 17:
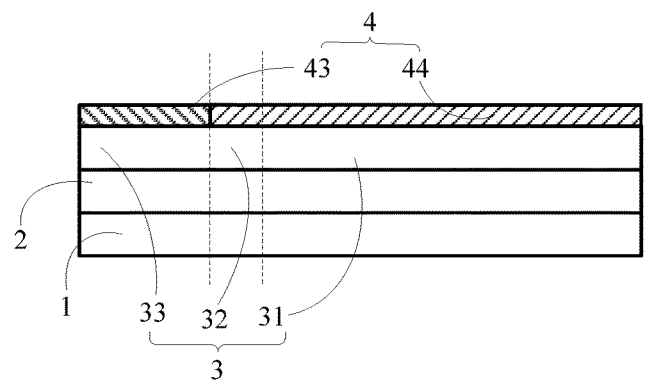
FIG. 17 is a schematic cross-sectional view illustrating an array substrate according to an exemplary embodiment of the present disclosure.
Figure 18:
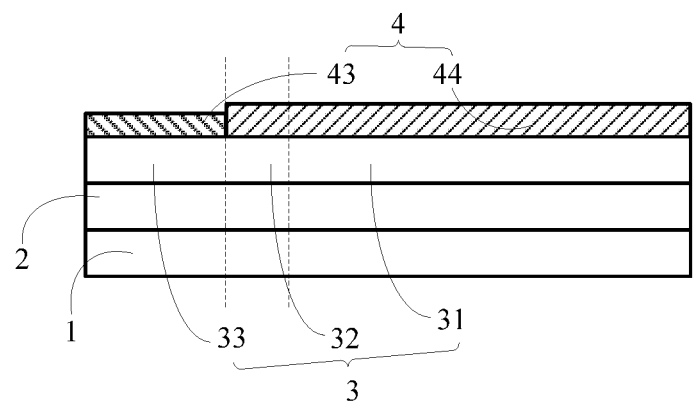
FIG. 18 is a schematic cross-sectional view illustrating an array substrate according to an exemplary embodiment of the present disclosure.

In another embodiment, as shown in FIG. 17, the second electrode layer 4 may include a third electrode 43 and a fourth electrode 44. The fourth electrode 44 may be disposed corresponding to the first light emitting region 31 and the second light emitting region 32, and the third electrode 43 may be disposed corresponding to the third light emitting region 33. The third electrode 43 is a transparent material layer, and the fourth electrode is a metal layer. Optionally, in another embodiment, as shown in FIG. 18, both of the third electrode 43 and the fourth electrode 44 are metal layers, and a thickness of the metal layer corresponding to the third electrode 43 is less than a thickness of the metal layer corresponding to the fourth electrode 44. In the embodiments shown in FIGS. 16-18, the transparent material layer may include one or more of indium tin oxide, indium zinc oxide, silver-doped indium tin oxide, and silver-doped indium zinc oxide. The metal layer 42 (as shown in FIG. 16) may include one material of Mg, Ag and Al, or an alloy made of multiple materials, such as MgAg alloy.

In the embodiment shown in FIG. 18, when the third electrode 43 is the metal layer, a thickness of the third electrode 43 is greater than 10 angstroms, and the third electrode 43 forms a planar electrode that is continuous as a whole and has a transmittance greater than 40%. More preferably, the metal layer has a thickness greater than 50 angstroms, forms a planar electrode that is continuous as a whole, and has a transmittance greater than 40%.

Figure 19:
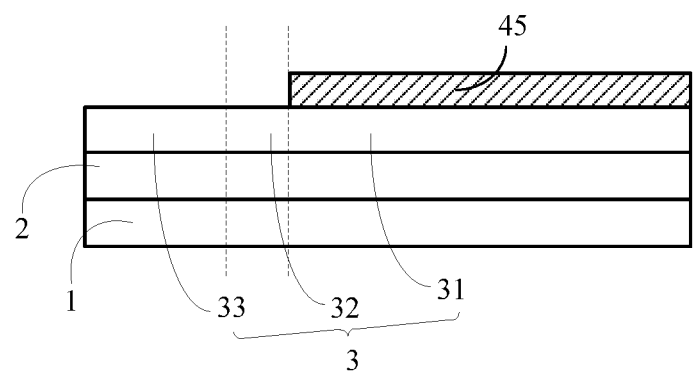
FIG. 19 is a schematic cross-sectional view illustrating an array substrate according to an exemplary embodiment of the present disclosure.

In yet another embodiment, as shown in FIG. 19, the second electrode layer includes a fifth electrode 45 disposed corresponding to the first light emitting region, and the fifth electrode is a planar electrode.

Preferably, the fifth electrode 45 has a single-layer structure or a laminated structure. When the fifth electrode 45 has the single-layer structure, the fifth electrode is a single metal layer, a single metal mixture layer, or a single transparent metal oxide layer. When the fifth electrode has the laminated structure, the fifth electrode is a laminated layer of a transparent metal oxide layer and a metal layer, or the fifth electrode is a laminated layer of a transparent metal oxide layer and a metal mixture layer.

Preferably, when the fifth electrode 45 is formed of a material doped with metal, and the fifth electrode has a thickness greater than or equal to 100 angstroms and less than or equal to 500 angstroms, the fifth electrode is a planar electrode that is continuous as a whole and has a transmittance greater than 40%.

Preferably, when the fifth electrode 45 is formed of a material doped with metal, and the fifth electrode has a thickness greater than or equal to 100 angstroms and less than or equal to 200 angstroms, the fifth electrode is a planar electrode that is continuous as a whole and has a transmittance greater than 40%.

Preferably, when the fifth electrode 45 is formed of a material doped with metal, and the fifth electrode has a thickness greater than or equal to 50 angstroms and less than or equal to 200 angstroms, the fifth electrode is a planar electrode that is continuous as a whole and has a transmittance greater than 50%.

Preferably, when the fifth electrode 45 is formed of a material doped with metal, and the fifth electrode has a thickness greater than or equal to 50 angstroms and less than or equal to 200 angstroms, the fifth electrode is a planar electrode that is continuous as a whole and has a transmittance greater than 60%.

Preferably, when the fifth electrode 45 has the single-layer structure, the material of the single metal layer is Al, Ag, the material of the single metal mixture layer is MgAg or an metal mixed material doped with Al, and the transparent metal oxide is ITO or IZO.

Figure 20:
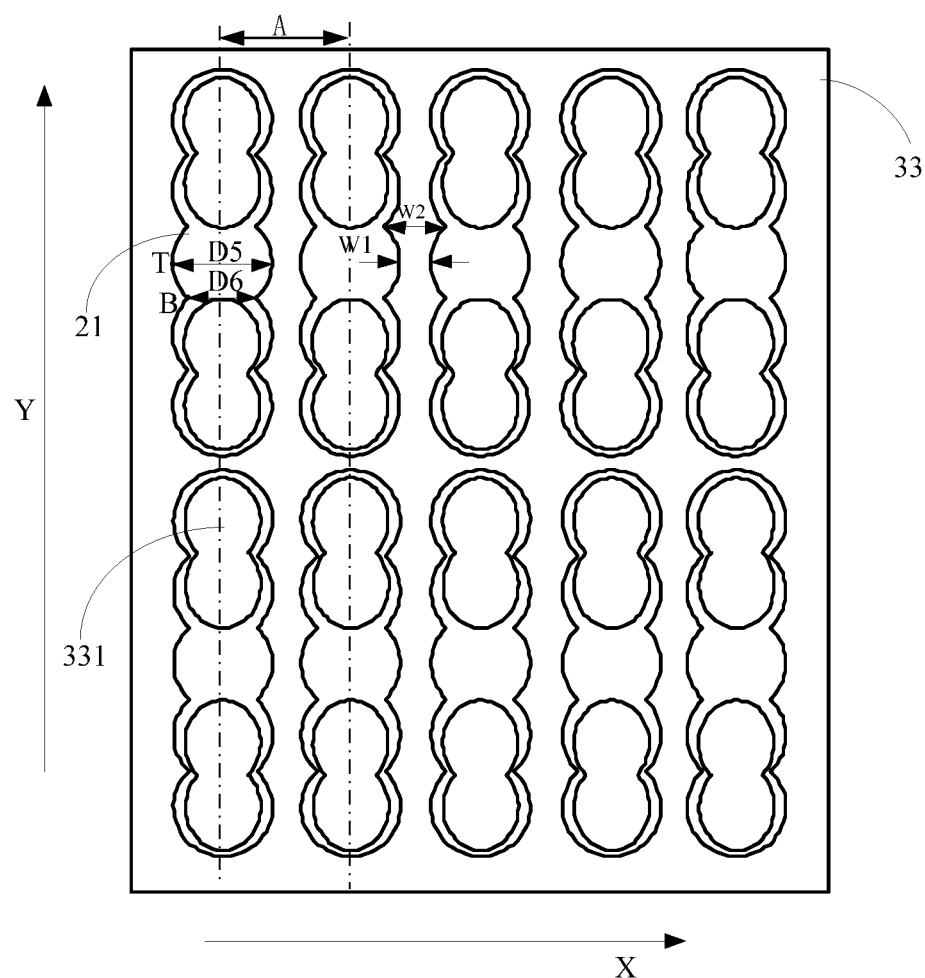
FIG. 20 is a schematic structural diagram illustrating a third light emitting region on another array substrate according to an exemplary embodiment of the present disclosure.
Figure 22:
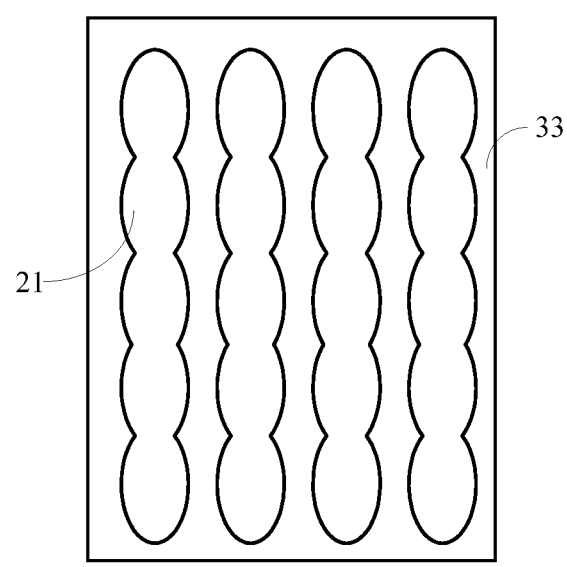
FIG. 22 is a schematic structural diagram illustrating a third light emitting region on another array substrate according to an exemplary embodiment of the present disclosure.

As shown in FIG. 20, in the direction in which each first electrode extends, two edges of the first electrode are both wave-shaped, and peaks of the two edges are arranged opposite to each other and troughs of the two edges are arranged opposite to each other. Therefore, gaps between two adjacent columns of first electrodes may be uncontinuously changed in the extending direction (the direction indicated by Y in FIG. 20). Of course, the gaps between two adjacent columns of first electrodes may be continuously changed in the extending direction, that is, one column of first electrode includes one first electrode 21 to cause the continuous change of the gaps, as shown in FIG. 22. The first electrode 21 may be periodically changed in the extending direction regardless of whether its width changes continuously or uncontinuously, and a length of one change period may correspond to a width of one pixel. In this way, while ensuring that the display transition is enabled between the first light emitting region and the third light emitting region, it is possible to reduce the probability of diffraction occurred due to the gap between adjacent first electrodes when the light passes through the third light emitting region.

The third light emitting region 33 may be provided with a plurality of columns of wave-shaped first electrodes, so that the width of the first electrode continuously changes or uncontinuously changes in the extending direction of the first electrode, thereby enabling the two adjacent first electrodes to have a continuously changing distance or an uncontinuously changing distance therebetween. Therefore, between locations of the first electrodes which have different widths, as well as between adjacent first electrodes which have different distances, the positions in which diffraction fringes are generated are different, so that the diffraction effects at different positions may be offset with each other, which may effectively reduce the diffraction effect, and is beneficial to improve the photographing effect of the camera located beneath the third light emitting region 33.

Specifically, in an embodiment, still referring to FIG. 20, the first electrodes in the form of multiple rows by multiple columns are described as an example. In this embodiment, the Y direction is a direction in which the first electrode extends, and the X direction is a direction in which the first electrodes are arranged. The shapes of the two edges of each first electrode in the X direction may include one or more peaks and one or more troughs. Taking the first electrode 21 as an example, the position indicated by T in FIG. 20 is the peak, and the position indicated by B in FIG. 20 is the trough. A width D5 between the opposite peaks of the two edges of the first electrode is 30 μm to (A-X) μm. A width D6 between the opposite troughs of the two edges is larger than X, and less than the width D5 between the opposite peaks, where A is a distance between the central axes of two adjacent first electrodes in the Y direction, X is the minimum process size, and the distance A is greater than or equal to (30+X) μm. In this embodiment, a value of X is 4 micrometers, and in other embodiments the value may be smaller.

Further, since the two edges of the two adjacent columns of first electrodes in the X direction are extended in a wave-shaped form, the distances between the two adjacent columns of first electrodes are also changed accordingly. In the present disclosure, a minimum distance W1 exists between opposite peaks of the two adjacent columns of first electrodes, and a maximum distance W2 exists between opposite troughs of the two columns of first electrodes. The minimum distance W1 is (A-D5), and the maximum distance W2 is (A-D6).

Figure 21:
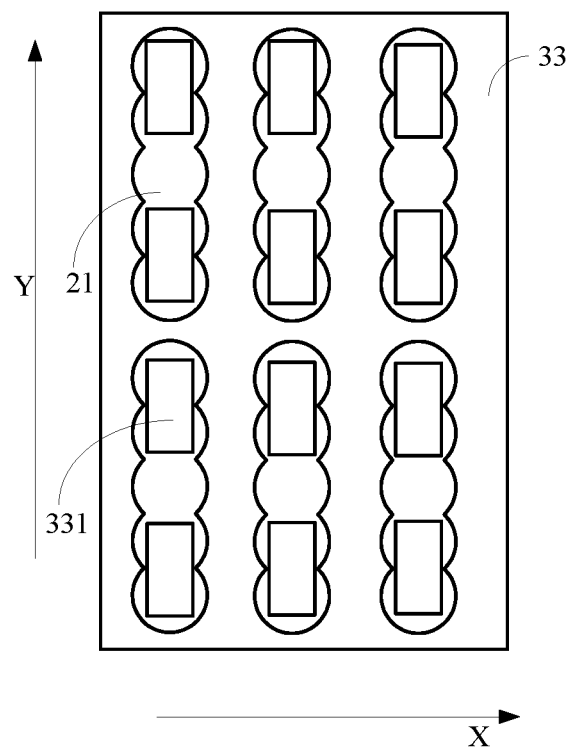
FIG. 21 is a schematic structural diagram illustrating a third light emitting region on another array substrate according to an exemplary embodiment of the present disclosure.

In this embodiment, taking the first electrode 21 as an example, as shown in FIG. 20, the shape of the third light emitting structure 331 disposed corresponding to the first electrode 21 may be the same as that of the first electrode 21. Optionally, as shown in FIG. 21, the shape of the third light emitting structure 331 disposed corresponding to the first electrode 21 may be different from that of the first electrode 21. For example, the third light emitting structure 331 may be rectangular as shown in FIG. 21. Or in other embodiments, the third light emitting structure 331 may also be circular or elliptical, etc., which is not limited in the present disclosure.

Figure 23:
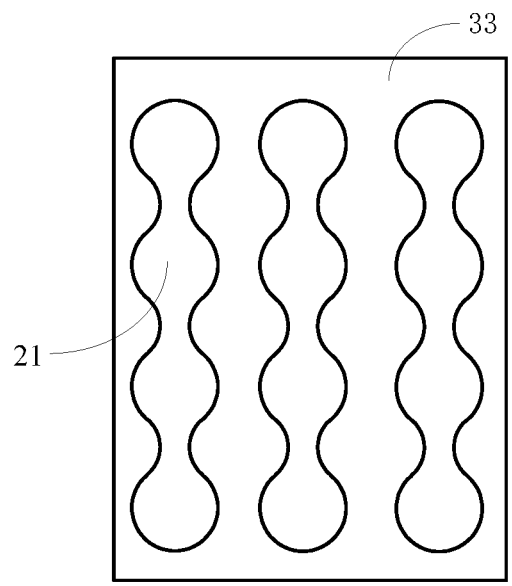
FIG. 23 is a schematic structural diagram illustrating a third light emitting region on another array substrate according to an exemplary embodiment of the present disclosure.

For the first electrodes with wave-shaped edges as described in the present disclosure, each column of first electrodes may include a plurality of graphic units, so that the above peaks and troughs may be formed. For example, as shown in FIGS. 20 and 21, each first electrode includes a plurality of circular graphic units. Optionally, as shown in FIG. 22, the first electrode 21 may include a plurality of elliptical graphic units. Optionally, as shown in FIG. 23, the first electrode 21 includes a plurality of dumbbell-shaped graphic units. Of course, in some embodiments, a gourd shape may be formed using two circular shapes, and a block-shaped electrode may be formed using a plurality of gourd shapes. For details, please refer to the situations shown in FIGS. 20 and 21.

Figure 24:
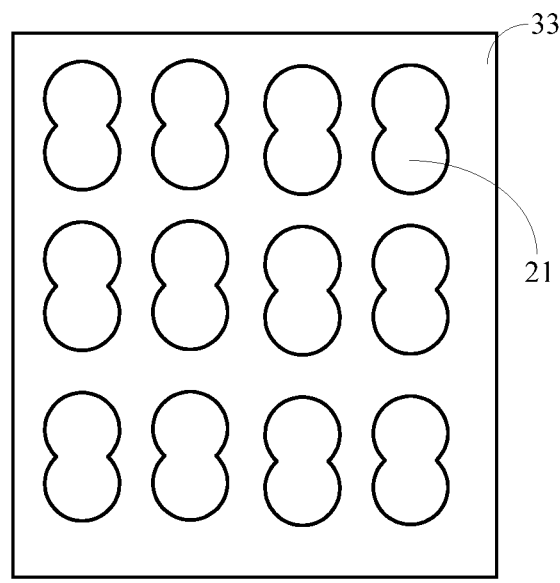
FIG. 24 is a schematic structural diagram illustrating a third light emitting region on another array substrate according to an exemplary embodiment of the present disclosure.
Figure 25:
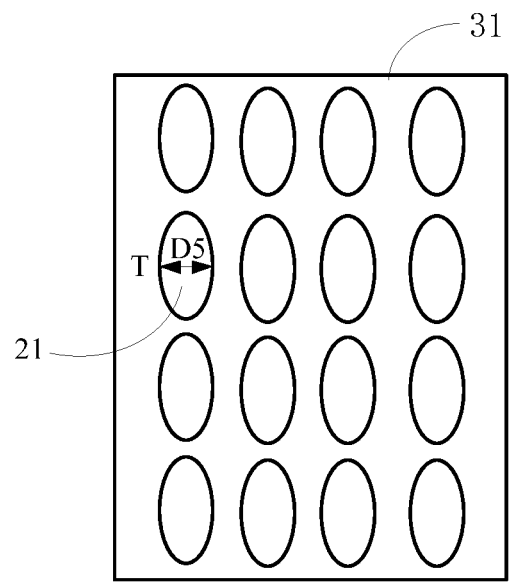
FIG. 25 is a schematic structural diagram illustrating a third light emitting region on another array substrate according to an exemplary embodiment of the present disclosure.

In an embodiment, as shown in FIG. 24, each column of first electrodes 21 may also include a single graphic unit, e.g., a gourd-shaped graphic unit shown in FIG. 24. As shown in FIG. 25, since the first electrode 21 includes an elliptical graphic unit, in this case, the first electrode 21 includes only the peak and has no trough, so that a width between the opposite troughs of the first electrode 21 is not defined.

Figure 26:
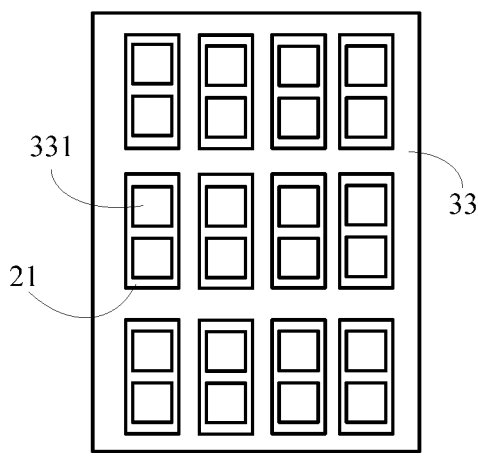
FIG. 26 is a schematic structural diagram illustrating a third light emitting region on another array substrate according to an exemplary embodiment of the present disclosure.

In another embodiment, as shown in FIG. 26, each column of first electrodes 21 may also be provided in a rectangular shape, for example, a square or oblong shape, which is not limited in the present disclosure. As still shown in FIG. 26, the third light emitting structure 331 corresponding to the rectangular first electrode 21 may also be rectangular. Of course, in other embodiments, the third light emitting structure 331 corresponding to the rectangular first electrode 21 may also be circular, elliptical or the like.

In the technical solution described in the present disclosure, the first electrode layer 2 may be made of a transparent material, and the second electrode layer 4 may also be made of a transparent material, or the first electrode layer 2 and the second electrode layer 4 are both made of a transparent material. Specifically, the transparent material has a light transmittance greater than or equal to 90%, which further improves the light transmittance of the third light emitting region 33, and even makes the light transmittance of the entire third light emitting region 33 above 80%. The transparent material may specifically include one or more of indium tin oxide, indium zinc oxide, silver-doped indium tin oxide, and silver-doped indium zinc oxide.

In an embodiment, the light emitting layer 3 may include an organic light emitting material layer and a common layer. The organic light emitting material layer may have a plurality of independent individuals to form corresponding organic light emitting structures. The common layer may include a hole injection layer, a hole transport layer, an electron transport layer, and an electron injection layer. The hole injection layer and the hole transport layer are disposed between the organic light emitting material layer and the first electrode layer 2 serving as an anode (i.e., for providing holes), and the hole injection layer is disposed closer to the first electrode layer 2 than the hole transport layer. The electron injection layer and the electron transport layer are disposed between the organic light emitting material layer and the second electrode layer 4 serving as a cathode (i.e., for providing electrons), and the electron injection layer is disposed closer to the second electrode layer 4 than the electron transport layer. The hole injection layer covers the first electrode layer 2, and the gap between two adjacent columns of first electrodes. The first electrode layer 2 and the second electrode layer 4 may be insulated by the hole injection layer and other layers of the common layer to avoid the short circuit.

Figure 27:
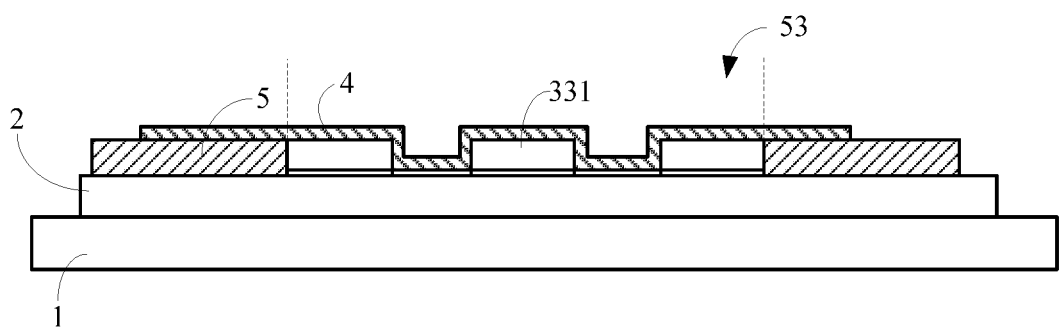
FIG. 27 is a schematic cross-sectional view illustrating another array substrate according to an exemplary embodiment of the present disclosure.
Figure 28:
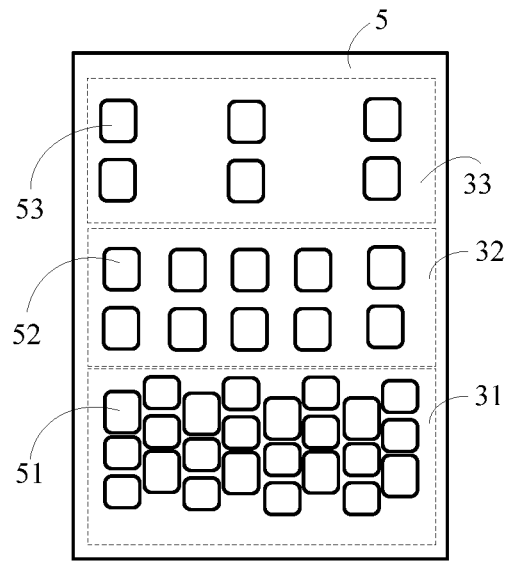
FIG. 28 is a schematic structural diagram illustrating still another array substrate according to an exemplary embodiment of the present disclosure.

In the above embodiments, as shown in FIGS. 27 and 28, the array substrate 100 may further include a pixel defining layer 5 formed on the first electrode layer 2. The pixel defining layer 5 includes a first pixel defining hole 51 disposed corresponding to the first light emitting region 31, a second pixel defining hole 52 disposed corresponding to the second light emitting region 32, and a third pixel defining hole 53 disposed corresponding to the third light emitting region 33. A plurality of third light emitting structures 331 may be formed in each third pixel defining hole 53; or, in another embodiment, a single third light emitting structure 331 may be formed in each third pixel defining hole 53, so as to reduce the risk of color mixing between adjacent third light emitting structures 331. The pixel defining layer 5 may be made of a transparent organic material as a whole; or, the pixel defining layer 5 may also be made of a transparent inorganic material; or, a section of the pixel defining layer 5 that is corresponding to the third light emitting region 33 may be made of a transparent material, and a section of the pixel defining layer 5 that is corresponding to the second light emitting region 32 may be made of a non-transparent material, which is not limited in the present disclosure.

Figure 29:
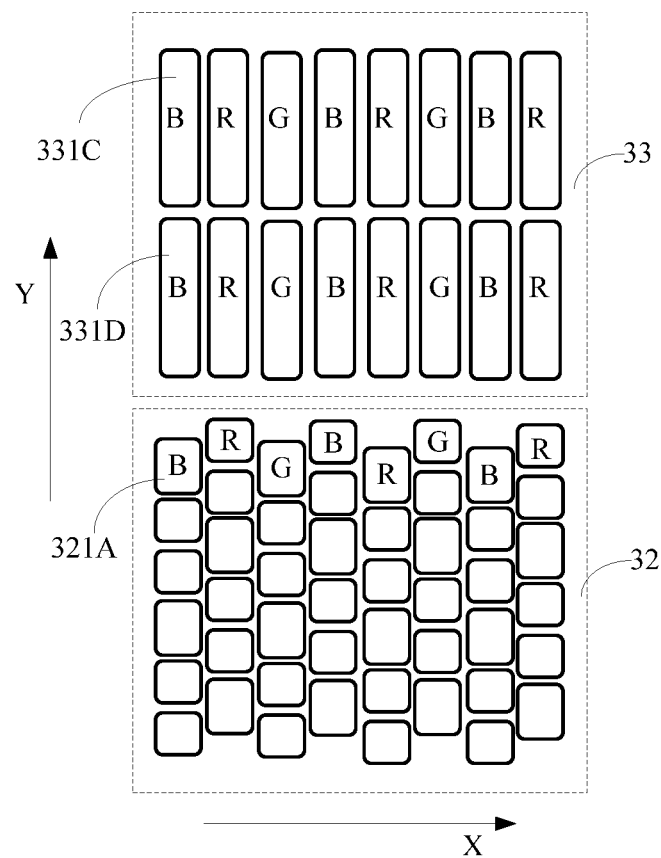
FIG. 29 is a schematic structural diagram illustrating still another array substrate according to an exemplary embodiment of the present disclosure.

Based on the technical solution of the present disclosure, as shown in FIG. 29, a plurality of second light emitting structures 321 and a plurality of third light emitting structures 331 are arranged in multiple columns and in a one-to-one correspondence. Compared with a solution in which a plurality of columns of third light emitting structures 331 correspond to one column of second light emitting structures 321, the distribution density in the third light emitting region 33 may be increased. The direction of the column in which the plurality of third light emitting structures 331 and the plurality of second light emitting structures 321 are arranged may be the Y direction as shown in FIG. 26. Of course, in other embodiments, the direction of the column in which the plurality of third light emitting structures 331 and the plurality of second light emitting structures 321 are arranged may be the X direction.

In this embodiment, as still shown in FIG. 29, the colors of the third light emitting structures 331 in the same column are the same as the color of one of the corresponding column of the second light emitting structures 321 which is disposed close to the third light emitting region 33, so as to reduce the process requirements for the third light emitting region 33 and reduce the risk of color mixing in the third light emitting region 33 in the same column direction. For example, in the left side in FIG. 29, a third light emitting structure 331C and a third light emitting structure 331D form one column, and a second light emitting structure 321A in a left column of second light emitting structures is close to the third light emitting region 33. Then, when the second light emitting structure 321A is blue, the third light emitting structure 331C and the third light emitting structure 331D are both blue; or, when the second light emitting structure 321A is green, the third light emitting structure 331C and the third light emitting structure 331D are both green; or, when the second light emitting structure 321A is red, the third light emitting structure 331C and the third light emitting structure 331D are both red.

Figure 30:
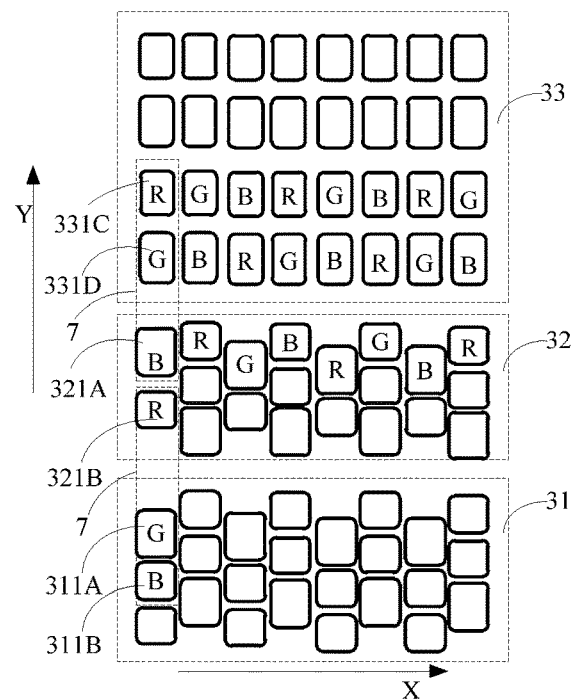
FIG. 30 is a schematic structural diagram illustrating still another array substrate according to an exemplary embodiment of the present disclosure.

In another embodiment, as shown in FIG. 30, one or more of a column of the second light emitting structures 321 which are disposed close to the third light emitting region 33, and adjacent one or more of the corresponding column of the third light emitting structures 331 may form a pixel unit 7. For example, as shown in FIG. 30, the second light emitting structure 321A, the third light emitting structure 331C, and the third light emitting structure 331D may form a pixel unit including red, green, and blue color blocks (as shown in the upper dashed box in FIG. 30). Similarly, one or more of a column of the second light emitting structures 321 which are disposed close to the first light emitting region 31, and adjacent one or more of the corresponding column of the first light emitting structures 311 may form a pixel unit 7. As still shown in FIG. 30, the second light emitting structure 321B, the first light emitting structure 311A, and the first light emitting structure 311B may form a pixel unit including red, green, and blue color blocks (as shown in the lower dashed box in FIG. 30).

Figure 31:
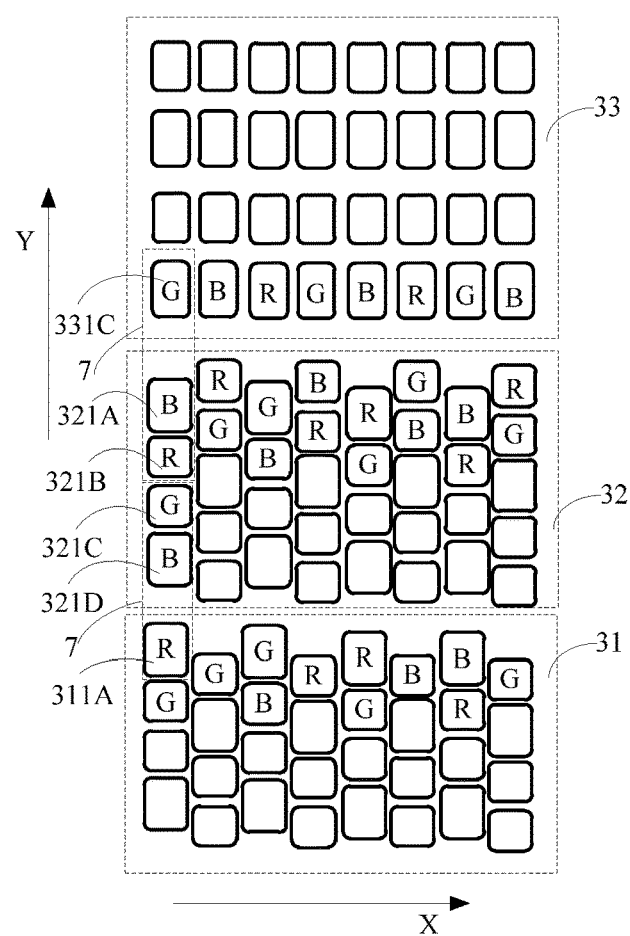
FIG. 31 is a schematic structural diagram illustrating still another array substrate according to an exemplary embodiment of the present disclosure.

Optionally, as shown in FIG. 31, the second light emitting structure 321A, the second light emitting structure 321B, and the third light emitting structure 331C may form a pixel unit 7 including red, green, and blue color blocks (as shown in the upper dashed box in FIG. 31). Based on this, display transition may be achieved at the junction of the third light emitting region 33 and the second light emitting region 32 to improve the display effect. Similarly, the second light emitting structure 321C, the second light emitting structure 321D, and the first light emitting structure 311A may form a pixel unit 7 including red, green, and blue color blocks (as shown in the lower dashed box in FIG. 31). Based on this, display transition may be achieved at the junction of the second light emitting region 32 and the first light emitting region 31 to improve the display effect.

In other embodiments, one pixel unit may also include two primary colors, such as red and green; or red and blue. For another example, in some embodiments, one pixel unit may also include four or more primary colors, so that the number of the third light emitting structures 331 and the second light emitting structures 321 forming one pixel unit may be adjusted accordingly.

Figure 32:
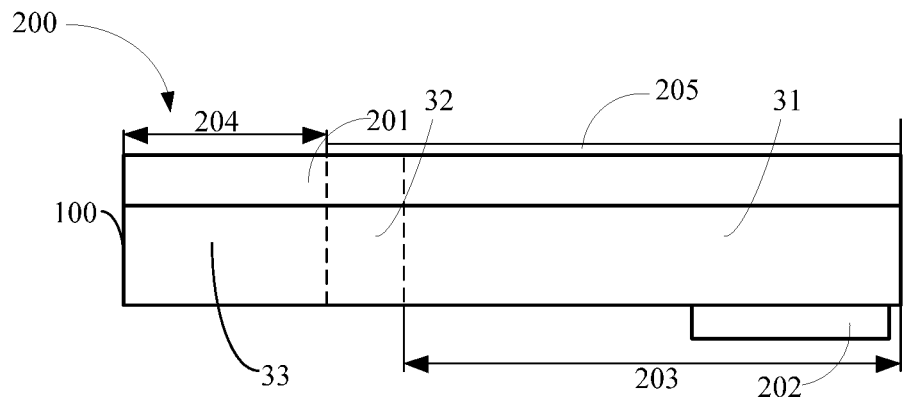
FIG. 32 is a schematic cross-sectional view illustrating a display panel according to an exemplary embodiment of the present disclosure.

In an embodiment of the present disclosure as shown in FIG. 32, a display panel 200 is also provided. The display panel 200 may include an encapsulation layer 201 and the array substrate 100 described in any of the above embodiments. The encapsulation layer 201 is disposed on a side of the array substrate 100 where the second electrode layer is located. Based on this, a transparent display region 204 disposed corresponding to the third light emitting region 33 and a non-transparent display region 203 disposed corresponding to the first light emitting region 31 may be formed on the display panel 200. Moreover, photoreceptor units may be placed beneath the transparent display region, and may collect external light or emit light outward through the transparent display region. Specifically, when the photoreceptor units are in operation, the transparent display region may be switched to a non-display state, and when the photoreceptor units are off, the transparent display region may be switched to a display state. The display panel may include a polarizer 205 that may cover the non-transparent region 203 corresponding to the first light emitting region 31 and does not cover the transparent display region 204, so as to prevent the polarizer from affecting incident external light, or affecting the light emitted from the electronic device equipped with the display panel 200. The polarizer may cover the second light emitting region 32 or a part of the second light emitting region 32, which is not limited in the present disclosure.

In this embodiment, the third light emitting region 33 of the array substrate 100 is at least partially surrounded by the second light emitting region 32, and the second light emitting region 32 is surrounded by the first light emitting region 31. And, the display panel 200 may further include a chip assembly 202. The chip assembly 202 may be configured to control display states of the third light emitting structures 331 and the second light emitting structures 321, and may enable the third light emitting structures 331 and the second light emitting structures 321 located at the junction of the third light emitting region 33 and the second light emitting region 32 to have the same color, thereby visually weakening the difference between the transparent display region and the non-transparent display region, and improving the user's visual effect.

Figure 33:
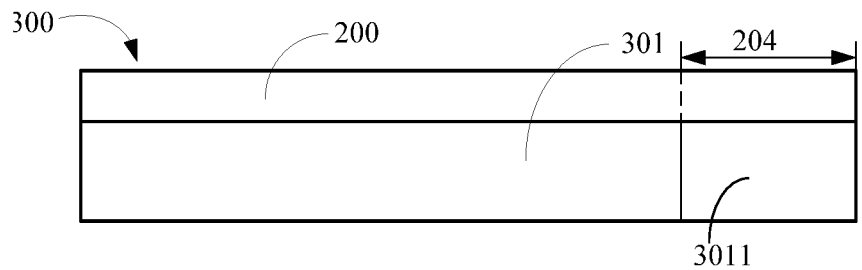
FIG. 33 is a schematic cross-sectional view illustrating a display apparatus according to an exemplary embodiment of the present disclosure.

An embodiment of the present disclosure further provides a display apparatus 300 as shown in FIG. 33. The display apparatus 300 may include a body 301 and the display panel 200 described in any of the above embodiments. The display panel 200 is provided on and connected with the body 301. The display panel 200 may use the display panel in any of the above embodiments to display static or dynamic images.

Figure 34:
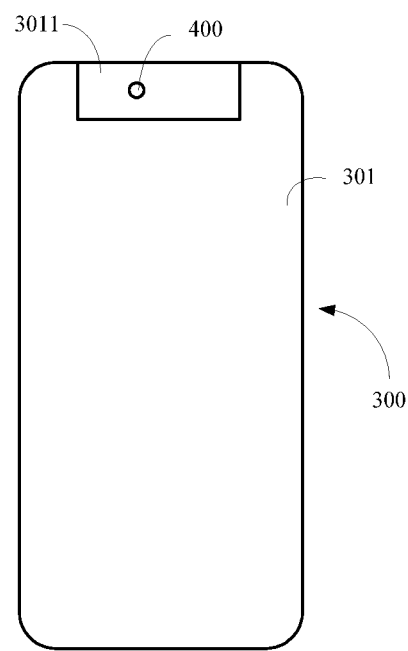
FIG. 34 is a schematic structural diagram illustrating a display apparatus according to an exemplary embodiment of the present disclosure.

In this embodiment, as shown in FIG. 34, the body 301 may include a component region 3011 which may be provided with photoreceptor units such as a camera 400, a light sensor and the like. At this time, the transparent display region of the display panel 200 is disposed to be corresponding to the component region 3011, so that the above-mentioned photoreceptor units such as the camera 400 and the light sensor may collect external light through the transparent display region. Since the third light emitting region of the array substrate may effectively improve the diffraction phenomenon caused by external light transmitting through the third light emitting region, the quality of the image captured by the camera 400 on the display apparatus may be effectively improved, and the distortion of the captured image caused by the diffraction may be avoided. In addition, the accuracy and sensitivity of the light sensor sensing external light may also be improved.

The display panel and the display apparatus provided by some embodiments of the present disclosure have the same beneficial effects as the above-described array substrate, which will not be repeated here.

The display apparatus may be any product or component with a display function such as a liquid crystal display apparatus, an electronic paper, a mobile phone, a tablet computer, a television, a display, a notebook computer, a digital photo frame, a navigator or the like.

Those skilled in the art can understand that the drawings are only schematic diagrams illustrating a preferred embodiment, and the modules or processes in the drawings are not necessarily required to implement the present disclosure. The foregoing descriptions are merely detailed embodiments of the present disclosure, but are not intended to limit the protection scope of the present disclosure. Any variation or replacement readily figured out by persons skilled in the art within the technical scope disclosed in this application shall fall within the protection scope of this application. Therefore, the protection scope of the present disclosure shall be subject to the protection scope of the claims.

The invention claimed is:

1. An array substrate, comprising:
   a base substrate;
   a first electrode layer formed on the base substrate;
   a light emitting layer formed on the first electrode layer;
      a non-transparent first light emitting region comprising a plurality of first light emitting structures;
      a second light emitting region comprising a plurality of second light emitting structures; and
      a transparent third light emitting region comprising a plurality of third light emitting structures, the second light emitting region being located between the first light emitting region and the third light emitting region; and a second electrode layer formed on the light emitting layer, wherein a distribution density of the plurality of first light emitting structures, a distribution density of the plurality of second light emitting structures and a distribution density of the plurality of third light emitting structures are changed gradually in sequence.

2. The array substrate according to claim 1, wherein the distribution density of the first light emitting structures, the distribution density of the second light emitting structures, and the distribution density of the third light emitting structures are gradually decreased in sequence.

3. The array substrate according to claim 2, wherein an area of each of the first light emitting structures, an area of each of the second light emitting structures and an area of each of the third light emitting structures are gradually increased; or a distance between adjacent ones of the first light emitting structures, a distance between adjacent ones of the second light emitting structures and a distance between adjacent ones of the third light emitting structures are gradually increased.

4. The array substrate according to claim 3, wherein the areas of the first light emitting structure, the second light emitting structure and the third light emitting structure are gradually increased, as lengths or widths of the first light emitting structure, the second light emitting structure and the third light emitting structure are gradually increased.

5. The array substrate according to claim 1, wherein the second light emitting region comprises:

a first transition region adjacent to the first light emitting region; and a second transition region located between the first transition region and the third light emitting region, wherein the first transition region and the second transition region are both non-transparent regions, the second transition region is provided with drive circuits electrically connected to the third light emitting structures through wires, and the second transition region is configured not to be covered by a polarizer.

6. The array substrate according to claim 1, wherein the first electrode layer comprises a plurality of first electrodes disposed corresponding to the third light emitting region, and the plurality of first electrodes are arranged in rows and columns;

wherein the first electrodes in each column are connected to a single one driving circuit; or each of the first electrodes is connected to a same drive circuit.

7. The array substrate according to claim 1, wherein the first electrode layer comprises a plurality of first electrodes disposed corresponding to the third light emitting region, each of the first electrodes corresponds to a group of the plurality of third light emitting structures respectively, having a same color, the first electrodes are strip-shaped electrodes, and the plurality of first electrodes are arranged in multiple rows by multiple columns or in one row by multiple columns, the first electrodes have an extending direction parallel or perpendicular to a row direction of the third light emitting structures;

each of the first electrodes corresponds to multiple columns of the third light emitting structures which are arranged along a first direction, and the first direction is the extending direction of the first electrode.

8. The array substrate according to claim 7, wherein two of the third light emitting structures adjacent in a second direction and located on a same first electrode are aligned or offset, and the second direction is perpendicular to the first direction.

9. The array substrate according to claim 8, wherein when the adjacent two of the third light emitting structures are arranged to be offset, a distance in the first direction between central axes of the adjacent two third light emitting structures on the same first electrode is 0.5-2 times a size of each of the third light emitting structures in the first direction.

10. The array substrate according to claim 7, wherein each of the first electrodes comprises:

a plurality of first sub-electrodes arranged in a misaligned manner in the second direction, wherein each of the first sub-electrodes corresponds to the third light emitting structures which are arranged in one column along the first direction, each of the first sub-electrodes comprises a plurality of block-shaped electrodes, and the second direction is perpendicular to the first direction; and a connection portion electrically connected with adjacent two of the block-shaped electrodes to obtain the first electrode which is wave-shaped and extends in the first direction.

11. The array substrate according to claim 10, wherein the third light emitting structures which are corresponding to adjacent two of the first electrodes are arranged to be aligned or offset.

12. The array substrate according to claim 1, wherein the first electrode layer is an anode, the second electrode layer is a cathode, and the second electrode layer is a planar electrode;

the second electrode layer comprises:

a transparent material layer covering the first light emitting region, the second light emitting region, and the third light emitting region; and a metal layer disposed on the transparent material layer, and covering the first light emitting region and the second light emitting region.

13. The array substrate according to claim 1, wherein the first electrode layer is an anode, the second electrode layer is a cathode, and the second electrode layer is a planar electrode;

the second electrode layer comprises:

a third electrode disposed corresponding to the third light emitting region; and a fourth electrode disposed corresponding to the first light emitting region and the second light emitting region;

wherein both of the third electrode and the fourth electrode are metal layers, and the third electrode has a thickness less than a thickness of the fourth electrode.

14. The array substrate according to claim 1, wherein the first electrode layer is an anode, the second electrode layer is a cathode, and the second electrode layer is a planar electrode;

the second electrode layer comprises a fifth electrode disposed corresponding to the first light emitting region, and the fifth electrode is a planar electrode;

the fifth electrode has a single-layer structure or a laminated structure, when the fifth electrode has the single-layer structure, the fifth electrode is a single metal layer, a single-layer metal mixture layer, or a single-layer transparent metal oxide layer; and when the fifth electrode has the laminated structure, the fifth electrode is a laminated layer of a transparent metal oxide layer and a metal layer, or the fifth electrode is a laminated layer of a transparent metal oxide layer and a metal mixture layer;

when the fifth electrode has a material doped with metal, and the fifth electrode has a thickness greater than or equal to 100 angstroms and less than or equal to 500 angstroms, the fifth electrode is the planar electrode that is continuous as a whole, and has a transmittance greater than 40%;

when the fifth electrode has the material doped with metal, and the fifth electrode has a thickness greater than or equal to 100 angstroms and less than or equal to 200 angstroms, the fifth electrode is the planar electrode that is continuous as a whole, and has the transmittance greater than 40%;

when the fifth electrode has the material doped with metal, and the fifth electrode has a thickness greater than or equal to 50 angstroms and less than or equal to 200 angstroms, the fifth electrode is the planar electrode that is continuous as a whole, and has a transmittance greater than 50%;

when the fifth electrode has the material doped with metal, and the fifth electrode has the thickness greater than or equal to 50 angstroms and less than or equal to 200 angstroms, the fifth electrode is the planar electrode that is continuous as a whole, and has a transmittance greater than 60%; and when the fifth electrode has the single-layer structure, a material of the single metal layer is Al, Ag, a material of the single metal mixture layer is Mg, Ag or a metal mixed material doped with Al, and a material of the transparent metal oxide layer is ITO or IZO.

15. The array substrate according to claim 6, wherein two edges of each of the first electrodes which are in an extending direction of the first electrode are both wave-shaped, peaks of the two edges of the first electrode are arranged opposite to each other, and troughs of the two edges of the first electrode are arranged opposite to each other, an orthographic projection of each of the first electrodes on the base substrate comprises one or more graphic units;

two edges of each of the third light emitting structures in the extending direction of the first electrode are both wave-shaped, peaks of the two edges of the third light emitting structure are arranged opposite to each other, and troughs of the two edges of the third light emitting structure are arranged opposite to each other, and an orthographic projection of each of the third light emitting structures on the base substrate comprises one or more graphic units.

16. The array substrate according to claim 1, further comprising:

a pixel defining layer formed on the first electrode layer and comprising a plurality of pixel defining holes corresponding to the third light emitting region, and each of the pixel defining holes corresponding to one or more of the third light emitting structures.

17. The array substrate according to claim 1, wherein the plurality of first light emitting structures, the plurality of second light emitting structures, and the plurality of third light emitting structures are all arranged in multiple columns and in a one-to-one correspondence, colors of ones of the third light emitting structures which are in a same column are the same as a color of one of a corresponding column of the second light emitting structures which is disposed close to the third light emitting region.

18. The array substrate according to claim 1, wherein the plurality of first light emitting structures, the plurality of second light emitting structures, and the plurality of third light emitting structures are all arranged in multiple columns and in a one-to-one correspondence, the array substrate comprises a plurality of pixel units, and each of the pixel units comprises one or more of a column of the second light emitting structures which are disposed close to the third light emitting region, and one or more of a corresponding column of adjacent third light emitting structures; and/or each of the pixel units comprises one or more of a column of the second light emitting structures which are disposed close to the first light emitting region, and one or more of a corresponding column of adjacent first light emitting structures.

19. A display panel, comprising:
the array substrate according to claim 1; and
an encapsulation layer provided on a side of the array substrate where the second electrode layer is located.

20. A display apparatus, comprising:
a body having a component region; and
the display panel according to claim 19, provided on a side of the body where the component region is located;
wherein a region of the display panel corresponding to the third light emitting region covers the component region, and the component region comprises photoreceptor units to emit or collect light through the region of the display panel corresponding to the third light emitting region.

* * * * *